United States Patent
Harrison

(10) Patent No.: US 8,583,200 B2
(45) Date of Patent: Nov. 12, 2013

(54) DEMOUNTABLE CURRENT LEAD UNIT AND SUPERCONDUCTING MAGNET APPARATUS EMPLOYING THE SAME

(75) Inventor: Stephen M Harrison, Wallingford (GB)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/546,606

(22) Filed: Jul. 11, 2012

(65) Prior Publication Data

US 2013/0123109 A1    May 16, 2013

(30) Foreign Application Priority Data

Nov. 14, 2011  (KR) .................. 10-2011-0118516

(51) Int. Cl.
*H01L 39/00* (2006.01)
(52) U.S. Cl.
USPC .......................... 505/160; 335/216
(58) Field of Classification Search
USPC ............... 505/160, 163, 211; 335/216
See application file for complete search history.

(56) References Cited

U.S. PATENT DOCUMENTS

| | | | |
|---|---|---|---|
| 2004/0222011 A1* | 11/2004 | Kohayashi et al. | 174/125.1 |
| 2004/0239462 A1 | 12/2004 | Nemoto et al. | |
| 2005/0193745 A1 | 9/2005 | Mangano et al. | |
| 2007/0213227 A1* | 9/2007 | Ekbote et al. | 505/220 |
| 2008/0079428 A1* | 4/2008 | Huang et al. | 324/318 |
| 2010/0051307 A1* | 3/2010 | Tigwell et al. | 174/15.5 |
| 2012/0309631 A1* | 12/2012 | Arndt et al. | 505/220 |

FOREIGN PATENT DOCUMENTS

| | | |
|---|---|---|
| EP | 0691722 A1 | 1/1996 |
| EP | 1830445 A1 | 9/2007 |
| GB | 2457706 A | 8/2009 |
| JP | 55-016487 A | 2/1980 |
| JP | 55-127005 A | 10/1980 |
| JP | 05-013826 A | 1/1993 |
| JP | 05-291036 A | 11/1993 |
| JP | 2545452 B2 | 10/1996 |
| JP | 2002-270913 A | 9/2002 |
| JP | 2004-111581 A | 4/2004 |
| JP | 2008-125589 A | 6/2008 |

* cited by examiner

*Primary Examiner* — Colleen Dunn
(74) *Attorney, Agent, or Firm* — Cha & Reiter, LLC

(57) ABSTRACT

A demountable current lead unit and a superconducting magnet apparatus employing the same include an inserting module that is demountably inserted into a superconducting magnet apparatus and electrode leads electrically connected to a superconducting coil and cooling pipes disposed in the respective electrode leads; a service module including a power supply source for supplying a current to the electrode leads, a refrigerant storage tank for supplying a refrigerant to the cooling pipe, and a controller for controlling a flow of the refrigerant to the cooling pipe; and a transmission pipe line for connecting the inserting module and the service module.

17 Claims, 2 Drawing Sheets

DEMOUNTABLE CURRENT LEAD UNIT AND SUPERCONDUCTING MAGNET APPARATUS EMPLOYING THE SAME

CLAIM OF PRIORITY

This application claims, pursuant to 35 U.S.C. §119(a), priority to and the benefit of the earlier filing date of Korean Patent Application No. 10-2011-0118516, filed on Nov. 14, 2011, in the Korean Intellectual Property Office, the disclosure of which is incorporated herein in its entirety by reference.

BACKGROUND OF THE INVENTION

1. Field of the Invention

The present invention relates to a current lead unit and a superconducting magnet apparatus employing the same, and more particularly, to a demountable current lead unit and a superconducting magnet apparatus employing the same.

2. Description of the Related Art

A magnetic resonance imaging (MRI) apparatus includes a superconducting magnet. When the MRI apparatus is in charging operation mode, a current is transmitted from a power source at an ambient temperature, via current leads, to the superconducting magnet at an ultralow temperature of 4.2K maintained by cryogenic coolant. Since the superconducting magnet is usually operated with such a very high current (500 A is typical for an MRI apparatus), the current leads often serve as a significant heat source that transfers heat to the cryogenic coolant.

Traditionally, cryogenic losses in the current leads are addressed by cooling the current leads in a flow of helium gas boiled off from a liquid helium supply used to cool the superconducting magnet. Also, in the MRI apparatus, the cryogenic losses in the current leads may be reduced by disassembling the current lead part.

Meanwhile, even when the MRI apparatus is set in persistent operation mode, a current circulating in the superconducting magnet decays at a very slow exponential rate, and thus, it is necessary to increase the current to a predetermined maximum level at intervals. Since the current leads are cooled by liquid helium from a helium supply for cooling the superconducting magnet, a process for resupplying the current may also involve refilling the MRI apparatus with liquid helium. However, the process for refilling the liquid helium is costly and relatively complex.

SUMMARY OF THE INVENTION

The present invention provides a demountable current lead unit that has an effective structure for supplying and resupplying a current to a superconducting magnet and discharging current from the superconducting magnet, and a superconducting magnet apparatus employing the demountable current lead unit.

According to an aspect of the present invention, there is provided a demountable current lead unit including: an inserting module that is demountably inserted into a superconducting magnet apparatus and includes an electrode lead electrically connected to a superconducting coil of the superconducting magnet apparatus and a cooling pipe disposed in the electrode lead; a service module including a power supply source for supplying a current to the electrode lead, a refrigerant storage tank for supplying a refrigerant to the cooling pipe, and a controller for controlling a flow of the refrigerant to the cooling pipe; and a transmission pipe line for connecting the inserting module and the service module.

The refrigerant may be liquid nitrogen, liquid helium, or liquid neon.

One end of the current lead may be a contact end that is in contact with a fixed terminal of the superconducting coil. A refrigerant inlet of the cooling pipe may be disposed adjacent to the contact end. A refrigerant outlet of the cooling pipe may be disposed adjacent to another end of the current lead.

The transmission pipe line may be flexible. Accordingly, the inserting module may relatively move with respect to the service module, and thus only the inserting module may be inserted into an insertion unit of a superconducting magnet apparatus when the service module is fixed.

The demountable current lead unit may further include a valve disposed in an injection pipe for connecting the refrigerant storage tank and the cooling pipe or in a discharge pipe for connecting the cooling pipe and a refrigerant outlet of the service module to control a flow of the refrigerant.

The demountable current lead unit may further include a temperature sensor to sense a temperature of a discharge pipe for connecting the cooling pipe and a refrigerant outlet of the service module and a heater for controlling a temperature of the discharge pipe.

According to another aspect of the present invention, there is provided a superconducting magnet apparatus including: a current lead unit; a superconducting magnet cryostat including an inserting portion; a superconducting coil disposed in an inner space of the superconducting magnet cryostat; and a fixed terminal that is electrically connected to the superconducting coil and of which one side is exposed by the inserting portion, wherein the current lead unit includes: an inserting module including an electrode lead that is demountably inserted into the inserting portion of the superconducting magnet apparatus and contacts electrically with the fixed terminal and a cooling pipe disposed in the electrode lead; a service module including a power supply source for supplying a current to the electrode lead, a refrigerant storage tank for supplying a refrigerant to the cooling pipe, and a controller for controlling a flow of the refrigerant to the cooling pipe; and a transmission pipe line for connecting the inserting module and the service module.

The demountable current lead unit and the superconducting magnet apparatus employing the same provide an effective method of supplying and resupplying a current to a superconducting magnet and discharging a current from the superconducting magnet. For example, since a cryogenic fluid which is separately supplied is used to cool a current lead instead of an ultralow temperature refrigerant contained in a cryostat for a superconducting magnet, an ultralow temperature refrigerant for a superconducting magnet is not affected by changes in a current and a magnetic field, and the current and the magnetic field may be changed without causing a serious loss of ultralow temperature refrigerant.

The superconducting magnet apparatus may be an MRI apparatus, a superconducting magnet apparatus for a magnetic levitation type car, a superconducting energy storage apparatus, or a superconducting magnetic separator.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
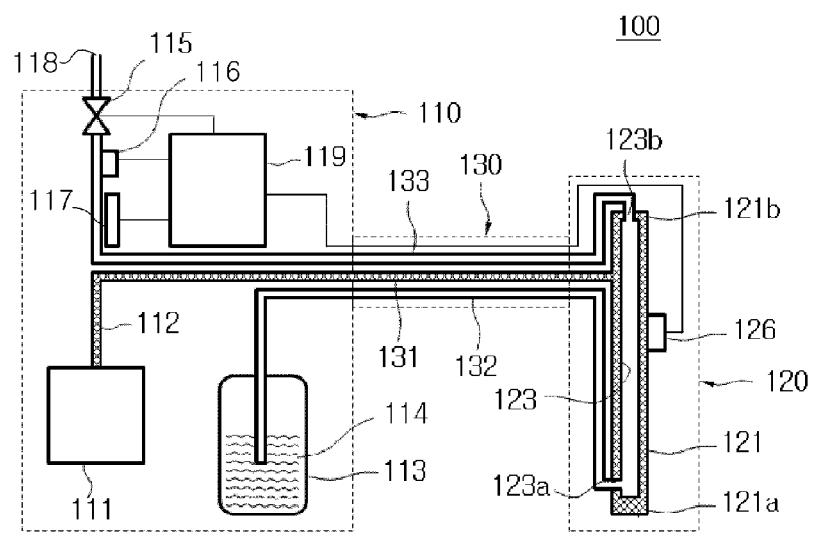
FIG. 1 is a schematic view of a demountable current lead unit according to an exemplary embodiment of the present invention.

Hereinafter, the present invention will be described in detail by explaining preferred embodiments of the invention with reference to the attached drawings. This invention may, however, be embodied in many different forms and should not be construed as limited to the exemplary embodiments set forth herein. The same reference numerals in the drawings denote the same element. In the drawings, the thicknesses of layers and regions are exaggerated for clarity. In the following description, a detailed explanation of known related functions and constructions may be omitted to avoid unnecessarily obscuring the subject matter of the present invention. Also, terms described herein, which are defined considering the functions of the present invention, may be implemented differently depending on user and operator's intention and practice. Therefore, the terms should be understood on the basis of the disclosure throughout the specification. The principles and features of this invention may be employed in varied and numerous embodiments without departing from the scope of the invention.

Furthermore, although the drawings represent exemplary embodiments of the invention, the drawings are not necessarily to scale and certain features may be exaggerated or omitted in order to more clearly illustrate and explain the present invention.

FIG. 1 is a schematic view of a demountable current lead unit 100 according to an exemplary embodiment of the present invention. As defined herein, the term "demountable" means removable or capable of being unmounted or dismounted from a placed or mounted state.

Referring to FIG. 1, the current lead unit 100 includes a service module 110, an inserting module 120 including current leads 121, and a transmission pipe line 130 for connecting the service module 110 and the inserting module 120.

Figure 2:
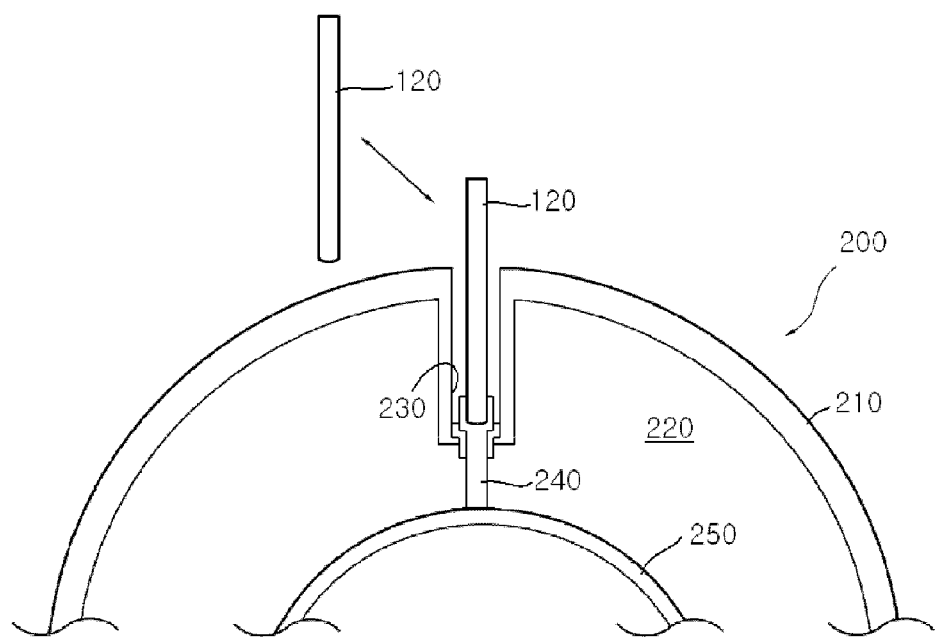
FIG. 2 is a schematic view of a superconducting magnet apparatus employing the demountable current lead unit shown in FIG. 1.

The service module 110 includes a power supply source 111, a refrigerant storage tank 113, and a controller 119. The power supply source 111 is used to supply power over an electrical connector 112, such as a wire, to the current leads 121 to change a current and a magnetic field of a superconducting coil 250, shown in FIG. 2. The refrigerant storage tank 113 stores a refrigerant 114. The refrigerant 114 may be a cryogenic fluid such as liquid nitrogen, liquid helium, or liquid neon. The refrigerant 114 contained in the refrigerant storage tank 113 is separate from and independent of a refrigerant for cooling a superconducting coil 250, as shown in FIG. 2. The controller 119 controls flow of the refrigerant 114 for cooling the current leads 121.

The inserting module 120 includes the current leads 121, a cooling pipe 123 used to cool the current leads 121, and a temperature sensor 126 attached to the current leads 121.

Each of the current leads 121 includes a contact end 121a for contacting the superconducting coil 250 and/or fixed terminals 240 electrically connected to the superconducting coil 250, to transfer electrical energy thereto. The current leads 121 and their contact ends 121a may be formed of a metal, e.g., copper, having high electrical conductivity at an ultralow temperature. In alternative embodiments, the current leads 121 may be formed of a high-temperature oxide superconductivity material known in the art. As shown in an exemplary embodiment in FIG. 1, the contact ends 121a are disposed at respective lower ends of the current leads 121, so that the plurality of contact ends 121a are capable of being demountably coupled to fixed terminals 240 of the superconducting coil 250, as shown in FIG. 2. In FIG. 1, only a single current lead 121 from among the plurality of current leads 121, and only a single contact end 121a of the plurality of contact ends 121 are shown for illustrative purposes only to facilitate the understanding of the present invention. It is understood that multiple current leads 121 and their corresponding multiple contact ends 121a may be included.

The cooling pipe 123 is formed to penetrate each of the current leads 121 so that the refrigerant 114 may flow into the current leads 121. An inlet 123a of the cooling pipe 123, into which the refrigerant 114 is injected, is disposed substantially adjacent to the contact ends 121a of the current leads 121, and an outlet 123b of the cooling pipe 123, from which the refrigerant 114 is discharged, may be disposed substantially adjacent to upper ends 121b of the current leads 121. Accordingly, the contact ends 121a of the current leads 121 may be relatively cooled more effectively.

The transmission pipe line 130 provides an electrical connection, a path of the refrigerant 114, and a mechanical connection between the service module 110 and the inserting module 120. The transmission pipe line 130 includes a wiring line 131 for connecting the power supply source 111 and the current leads 121 to provide the electrical connection, and the transmission pipe line 130 also includes an injection pipe 132 and a discharge pipe 133 into and from which the refrigerant 114 is injected and discharged, respectively, to provide the path for the flow of the refrigerant 114. The transmission pipe line 130 may be flexible, and thus, may allow the inserting module 120 to move relative to the service module 110.

A valve 115 for controlling a flow of the discharged refrigerant 114 may be is posed adjacent to the discharge pipe 133, through which the refrigerant 114 passes. As an another example, the valve 115 may be disposed adjacent to a refrigerant outlet 118. In addition, another valve (not shown) may be connected to the cooling pipe 123 to control the flow of refrigerant to the inlet 123a. Also, a temperature sensor 116 for monitoring the temperature of the discharge pipe 133, and a heater 117 to heat the outflowing discharged refrigerant 114 may be disposed adjacent to the discharge pipe 133 in order to reduce the difference of temperature of the discharged refrigerant 114 and any surrounding structures such as the refrigerant outlet 118, to avoid damage due to severe temperature differentials on the structures.

FIG. 2 is a schematic view of a superconducting magnet apparatus 200 employing the current lead unit 100 and the inserting module 120 shown in FIG. 1.

Referring to FIG. 2, the superconducting magnet apparatus 200 may include a superconducting magnet cryostat 210 and a superconducting coil 250 disposed in an inner space 220 of the superconducting magnet cryostat 210. An ultralow temperature refrigerant, e.g., helium, for cooling the superconducting coil 250 to a temperature of less than 4.2 K is filled in the inner space 220 of the superconducting magnet cryostat 210. The superconducting magnet apparatus 200 may further include a cooler for cooling the ultralow temperature refrigerant, an ultralow temperature refrigerant supplier for supplementing the ultralow temperature refrigerant to be vaporized, and the like. In the exemplary embodiment of the present invention, the superconducting magnet cryostat 210 employs a cryostat using an ultralow temperature refrigerant such as helium, but it is understood that, in alternative embodiments, the superconducting magnet cryostat 210 may employ a cryostat not using a refrigerant.

The superconducting magnet apparatus 200 may also include fixed terminals 240 for providing an external electrical connection, and the fixed terminals 240 may be disposed at both ends of the superconducting coil 250. An inserting portion 230, into which the inserting module 120 may be inserted, may be formed in the superconducting magnet cryostat 210, and one side of the inserting module 120 may be exposed to the outside via the inserting portion 230. The current leads 121 of the inserting module 120, shown in FIG. 1, may be inserted into the inserting portion 230 to be electrically connected to an exposed side of the fixed terminals 240. The insertion and removal of the inserting module 120 from the inserting portion 230, as indicated by the arrow in FIG. 2, may be performed automatically or manually by using a mechanical driving member.

The superconducting magnet apparatus 200 is an apparatus using a superconducting magnet, for example, in an MRI apparatus, a superconducting magnet apparatus for a magnetic levitation type car, a superconducting energy storage apparatus, or a superconducting magnetic separator. For example, when the superconducting magnet apparatus 200 is an MRI apparatus, the superconducting magnet apparatus 200 may further include a gradient coil or a radio frequency (RF) coil, and the like for performing MRI functions.

The superconducting magnet apparatus 200 of the exemplary embodiment of the present invention uses a refrigerant that is separately supplied to cool the current leads 121 instead of the ultralow temperature refrigerant contained in the superconducting magnet cryostat 210, and thus, the ultralow temperature refrigerant contained in the superconducting magnet cryostat 210 is not affected by changes of a current and a magnetic field. Accordingly, the superconducting magnet apparatus 200 of the exemplary embodiment may allow changes in the current and the magnetic field of the superconducting magnet without causing a significant loss of the ultralow temperature refrigerant.

However, unlike the present invention, in a conventional current lead cooler known in the art, a part of the ultralow temperature refrigerant for the superconducting magnet, for example, liquid helium, is consumed to cool a current lead while supplying a current to the superconducting magnet. Accordingly, the superconducting magnet cryostat 210 shown in FIG. 2 is required to recharge or have resupplied the ultralow temperature refrigerant flowing in the inner space 220 of the superconducting magnet cryostat 210. On the contrary, since the current leads 121 and contact ends 121a of the present invention are separately and independently cooled by the refrigerant 114, the present invention does not utilize the ultralow temperature refrigerant of the superconducting magnet, flowing in the inner space 220, for cooling the current leads 121 and the contact ends 121a, and the present invention does not consume such ultralow temperature refrigerant of the superconducting magnet. Therefore, using the present invention, there is less need for resupplying of the ultralow temperature refrigerant of the superconducting magnet, which interferes with the operation of the superconducting magnet.

Figure 3:
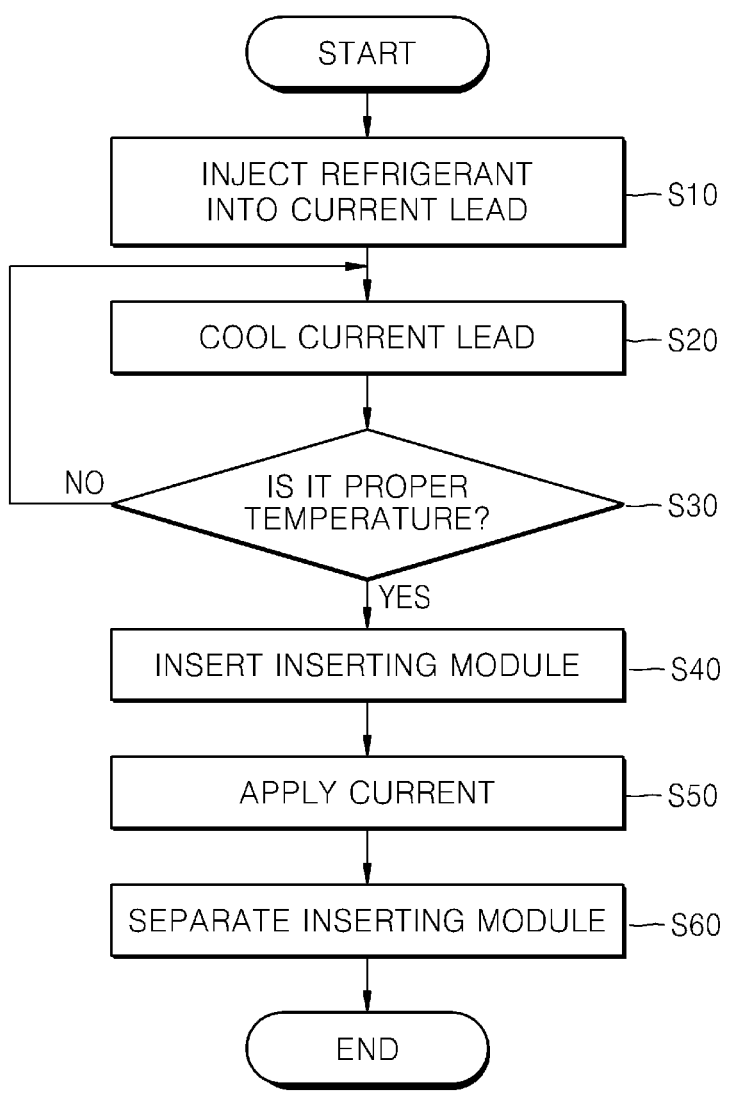
FIG. 3 is a flowchart for describing an operation of the demountable current lead unit shown in FIG. 1.

Next, an operation of the demountable current lead unit 100 will be described with reference to FIGS. 1 to 3. FIG. 3 is a flowchart for describing the operation of the current lead unit 100 of the exemplary embodiment of the present invention.

The refrigerant 114 is injected into the current leads 121 via the cooling pipe 123 by a known injection method, for example, by pressing or applying pressure within the refrigerant storage tank 113 of the service module 110 in step S10. In this regard, the refrigerant 114 is injected into the inlet 123a substantially adjacent to the contact end 121a, which is a lower end of the current leads 121, and passes through the cooling pipe 123 disposed in the current leads 121, and then is discharged through the outlet 123b substantially adjacent to an upper end of the current leads 121 to cool the current leads 121 in step S20. The refrigerant 114 used to cool the current leads 121 returns to the service module 110 to be discharged from the refrigerant outlet 118 of the service module 110. In this regard, the controller 119 controls a fluid speed and flow of the refrigerant 114 based on a temperature of the current leads 121 detected by the temperature sensor 126 disposed in the current leads 121. The fluid speed of the refrigerant 114 may be controlled by the valve 115 disposed in the discharge pipe 133. Furthermore, the temperature sensor 116 for a pipe and the heater 117 may further be disposed on or substantially adjacent to the discharge pipe 133. In this case, the controller 119 controls a temperature of the discharge pipe 133 by using the heater 117 based on a temperature detected by the temperature sensor 116 for a pipe, and allows a gas or liquid refrigerant 114 discharged from the service module 110 to be at or near a peripheral or ambient temperature.

Next, if it is determined that a temperature detected in the current leads 121 is equal to or less than a predetermined proper low temperature in step S30, such as 4.2K, the inserting module 120 is inserted into the inserting portion 230 of the superconducting magnet apparatus 200 in step S40. Otherwise, the method loops back to step S20 to continue to cool the current leads 121 until the detected temperature in step S30 drops to equal or below the predetermined temperature. If the current lead 121 of the inserting module 120 is in contact with the fixed terminals 240 of the superconducting magnet apparatus 200, the power supply source 111 supplies a current to the superconducting coil 250 in step S50 to change the current already supplied to the superconducting coil 250, thereby changing a magnetic field generated by the superconducting coil 250. Then, when the supply of current to the superconducting coil 250 is completed, the inserting module 120 is separated and removed from the inserting portion 230 of the superconducting magnet apparatus 200 in step S60. When the current and the magnetic field are finally changed, the injection of refrigerant 114 is controlled by the controller 119 so that the refrigerant 114 stops flowing to the injection pipe 132, the discharge pipe 133, and the current leads 121.

The above-described controlling operation has been described as an example, and thus, another controlling operation is possible. For example, when the superconducting magnet apparatus 200 is stopped, the current leads 121 may be in contact with the fixed terminals 240 of the superconducting magnet apparatus 200 to discharge a current supplied to the superconducting coil 250 via the steps S10 to S40 shown in FIG. 3.

A demountable current lead unit and a superconducting magnet apparatus employing the same have been described with reference to the exemplary embodiments shown in the drawings for facilitating the understanding of the present invention, but it will be understood by one of ordinary skill in the art that various changes in form and details may be made therein without departing from the spirit and scope of the present invention as defined by the following claims.

What is claimed is:

1. A demountable current lead unit comprising:
an inserting module that is demountably inserted into a superconducting magnet apparatus and comprises:
an electrode lead electrically connected to a superconducting coil of the superconducting magnet apparatus, and
a cooling pipe disposed in the electrode lead;
a service module comprising:
a power supply source for supplying a current to the electrode lead,
a refrigerant storage tank for supplying a refrigerant to the cooling pipe, and
a controller for controlling a flow of the refrigerant to the cooling pipe; and
a transmission pipe line for connecting the inserting module and the service module.

2. The demountable current lead unit of claim 1, wherein the refrigerant is liquid nitrogen, liquid helium, or liquid neon.

3. The demountable current lead unit of claim 1, wherein one end of the current lead is a contact end that is in contact with a fixed terminal of the superconducting coil.

4. The demountable current lead unit of claim 3, wherein a refrigerant inlet of the cooling pipe is disposed substantially adjacent to the contact end.

5. The demountable current lead unit of claim 4, wherein a refrigerant outlet of the cooling pipe is disposed substantially adjacent to another end of the current lead.

6. The demountable current lead unit of claim 1, wherein the transmission pipe line is flexible.

7. The demountable current lead unit of claim 1, further comprising a valve disposed in one of an injection pipe for connecting the refrigerant storage tank and the cooling pipe and in a discharge pipe for connecting the cooling pipe and a refrigerant outlet of the service module to control a flow of the refrigerant.

8. The demountable current lead unit of claim 1, further comprising:
a temperature sensor to sense a temperature of a discharge pipe for connecting the cooling pipe and a refrigerant outlet of the service module, and
a heater for controlling the temperature of the discharge pipe.

9. A superconducting magnet apparatus comprising:
a current lead unit;
a superconducting magnet cryostat comprising an inserting portion;
a superconducting coil disposed in an inner space of the superconducting magnet cryostat; and
a fixed terminal that is electrically connected to the superconducting coil and of which one side is exposed by the inserting portion,
wherein the current lead unit comprises:
an inserting module comprising:
an electrode lead that is demountably inserted into the inserting portion of the superconducting magnet apparatus and that contacts electrically with the fixed terminal, and
a cooling pipe disposed in the electrode lead;
a service module comprising:
a power supply source for supplying a current to the electrode lead,
a refrigerant storage tank for supplying a refrigerant to the cooling pipe, and
a controller for controlling a flow of the refrigerant to the cooling pipe; and
a transmission pipe line for connecting the inserting module and the service module.

10. The superconducting magnet apparatus of claim 9, wherein the refrigerant is liquid nitrogen, liquid helium, or liquid neon.

11. The superconducting magnet apparatus of claim 9, wherein one end of the current lead is a contact end that is in contact with the fixed terminal.

12. The superconducting magnet apparatus of claim 11, wherein a refrigerant inlet of the cooling pipe is disposed substantially adjacent to the contact end.

13. The superconducting magnet apparatus of claim 12, wherein a refrigerant outlet of the cooling pipe is disposed substantially adjacent to another end of the current lead.

14. The superconducting magnet apparatus of claim 9, wherein the transmission pipe line is flexible.

15. The superconducting magnet apparatus of claim 9, further comprising a valve disposed in one of an injection pipe for connecting the refrigerant storage tank and the cooling pipe and in a discharge pipe for connecting the cooling pipe and the refrigerant outlet of the service module to control a flow of the refrigerant.

16. The superconducting magnet apparatus of claim 9, further comprising:
a discharge pipe connecting the cooling pipe to a refrigerant outlet to direct refrigerant from the cooling pipe to the refrigerant outlet;
a temperature sensor for detecting the temperature of the refrigerant in the discharge pipe; and
a heater, responsive to the detected temperatures, for heating the refrigerant in the discharge pipe.

17. The superconducting magnet apparatus of claim 9, wherein the superconducting magnet apparatus is an MRI apparatus, a superconducting magnet apparatus for a magnetic levitation type car, a superconducting energy storage apparatus, or a superconducting magnetic separator.

* * * * *